(12) United States Patent
Dull

(10) Patent No.: US 6,518,936 B1
(45) Date of Patent: *Feb. 11, 2003

(54) PRECISION ETCHED RADOME

(75) Inventor: Dennis L. Dull, Sumner, WA (US)

(73) Assignee: The Boeing Company, Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/464,426

(22) Filed: Jun. 5, 1995

Related U.S. Application Data

(62) Division of application No. 08/147,183, filed on Nov. 3, 1993, now Pat. No. 5,468,409.

(51) Int. Cl.$^7$ ................................................ H01Q 1/42
(52) U.S. Cl. ........................................................ 343/872
(58) Field of Search ................................ 343/872, 873; 428/924, 626, 622, 674, 457, 601

(56) References Cited

U.S. PATENT DOCUMENTS

| | | | |
|---|---|---|---|
| 3,083,129 A | | 3/1963 | Jones et al. ................. 216/106 |
| 3,560,986 A | * | 2/1971 | Hoots et al. ................. 343/872 |
| 3,650,958 A | | 3/1972 | Shipley ...................... 252/79.1 |
| 3,753,818 A | | 8/1973 | Poor et al. ..................... 156/19 |
| 3,761,937 A | * | 9/1973 | Tricoles et al. .............. 343/872 |
| 3,907,565 A | * | 9/1975 | Burton et al. ................ 343/872 |
| 3,961,333 A | * | 6/1976 | Purinton ...................... 343/909 |
| 4,659,698 A | | 4/1987 | Traut ........................... 343/872 |
| 4,696,717 A | | 9/1987 | Bissinger ..................... 156/642 |
| 4,796,153 A | * | 1/1989 | Amason et al. .............. 361/218 |
| 5,127,991 A | * | 7/1992 | Lal et al. ................... 156/659.1 |
| 5,298,117 A | | 3/1994 | Hanson et al. ............... 156/666 |
| 5,304,428 A | * | 4/1994 | Takami ........................ 428/675 |
| 5,344,729 A | | 9/1994 | Akins et al. |
| 5,352,565 A | | 10/1994 | Schroeder .................... 430/320 |
| 5,650,249 A | | 7/1997 | Dull et al. ....................... 430/5 |

FOREIGN PATENT DOCUMENTS

JO  2149-684 A  6/1990  ................. 156/666

OTHER PUBLICATIONS

Missel et al., "Steady State Etching of Copper," Metal Finishing, Dec. 1969, pp. 47–58.

\* cited by examiner

*Primary Examiner*—John J. Zimmerman
(74) *Attorney, Agent, or Firm*—John C. Hammar

(57) ABSTRACT

Multicurved copper films having fine-line elements suitable for radome applications can be improved by cutting the elements with reproducible precision to close tolerance (typically line widths of 3–10±0.25 mil) using an etchant comprising a concentrated saline solution of $CuCl_2$.

12 Claims, 2 Drawing Sheets

PRECISION ETCHED RADOME

Reference to Related Applications

The present application is a divisional application based upon U.S. patent application Ser. No. 08/147,183, filed Nov. 3, 1993 now U.S. Pat. No. 5,468,409.

TECHNICAL FIELD

The present invention relates to a solution for etching copper and its method of use to make fine-line copper elements where the etching is precise to close tolerance. The method is particularly suited for articles having complex curvature. The copper elements are commonly used in radomes, which are the immediate focus of this application.

BACKGROUND ART

Circuit board elements are often etched on flat, plated surfaces in conventional etching processes using photolithographic techniques to define lines to specific tolerances of about ±1.0 mil (i.e., 0.001 in). The initial line width of typically about 2–15 mils is patterned in the photoresist before introducing the etchant. Generally, a strong acid such as ferric chloride is used as the etchant. Ferric chloride penetrates quickly through the copper film, and, because of its vigorous etch rate, only modest tolerances are achievable. The etchant begins to etch laterally (i.e., undercut) as it simultaneously continues to etch into the metal. The initial photoresist pattern must define openings in the photoresist narrower than the desired line width in the metal, because undercutting will occur. The etchant will penetrate beneath the photoresist film. The circuit board etching process must be monitored closely so that etching can be halted at the precise time. With a conventional etching process, like those using ferric chloride, it is difficult, if not impossible, to achieve line widths ranging from 3–10±0.25 mils (0.003–0.010 in) even on flat boards, because of the etch rate and inherent process delays. Our applications require this close tolerance on large parts having complex curvature. Control of line width is more difficult if the film has a complex curvature. With large parts, it becomes more difficult to flush or to neutralize the etchant to stop the etching. Using conventional circuit board etching processes, this precision is lost.

SUMMARY OF INVENTION

An etching solution especially valuable for precision etching of vapor deposited copper films of complex curvature comprises about 0.5 ft$^3$ etchant/ft$^2$ copper film (with a nominal thickness of about 0.1 mil), the solution being about 5 gm per liter of a mild copper etching acid, such as $CuCl_2$, and at least about 125 gm per liter of NaCl or another suitable salt in deionized water. We reproducibly achieve line widths of about 3–10 mil±0.25 mil.

We use this etchant to etch copper to high precision and can reliably and reproducibly prepare etched copper surfaces having complex curvature with elements etched to close tolerances as small as ±0.00025 in. We incorporate these copper surfaces into radomes, generally securing each copper surface between two dielectric sheets.

DETAILED DESCRIPTION OF THE INVENTION

Figure 2:
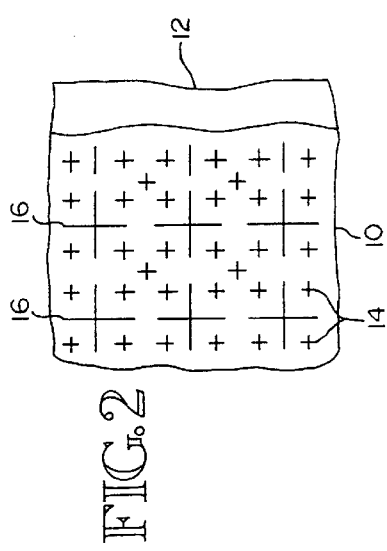
FIG. 2 is a schematic plan view of a portion of the copper film etched in the process of the present invention.

Controlling undercut in metal etching using photolithographic techniques is essential reproducibly and reliably to achieve close tolerances as small as ±0.00025 in (0.25 mil) on copper circuit board elements, especially for elements having complex curvature, such as those needed for radome applications. By using a mild copper etchant having a slow and well-defined etch rate, such as one containing dilute $CuCl_2$ and concentrated NaCl in deionized water, we can achieve a precision etch on large vapor deposited copper parts with lines controllably cut to the desired tolerance of ±0.25 mil using otherwise standard dip tank chemical etching equipment. Our preferred etchant comprises about 5 gm $CuCl_2$ and 150 gm NaCl per liter of deionized water. Our tests with this preferred saline etchant on vapor deposited copper using about 0.5 ft$^3$ etchant/ft$^2$ Cu show that the etch rate declines significantly (to less than 0.01 mil/min). With this etchant, then, we can immerse a large, multicurved element and can etch it precisely to close tolerance over relatively long immersion times because the etch rate decline is so dramatic that continued exposure to etchant has almost no effect. With this etchant, we have minimized the effects otherwise caused by relative orientation, solution depth, temperature distribution, natural convection, migration or electrolytic effects, and the like in producing etched copper circuit elements of line widths between about 3–10±0.25 mil for vapor deposited copper on plastic circuit board substrates.

In the method, we generally use conventional photolithography (i.e., a photoresist) to mask the copper and pattern the mask to expose line widths approximately 1 mil narrower than the desired final width. Typically, the copper is vapor deposited to a nominal thickness of about 0.1 mil. We use 0.5 ft$^3$ etchant/ft$^2$ Cu. The etchant has a composition of about 5 gm $CuCl_2$ and at least about 150 gm NaCl per liter deionized water (purity >1 megaohm–cm). The etchant is heated to about 140° F.±3° F. when the board is immersed in a quiescent, stagnant tank. The board remains immersed for about 25–45 minutes, and, preferably, 25–30 minutes before it is checked for completion. The part is monitored after checking until the desired line width is achieved. During immersion, there is no agitation. We have achieved repeatable, reliable etching to precise dimensions between 3–10 mil width with close tolerances of about ±0.25 mil on line width for all the lines.

The etchant is a mild acid so that its etch rate will be relatively slow. We typically use this process for etching large parts of high value to close tolerances where line width is important to control to achieve the desired functional performance. In this case, the etching time is insignificant. Therefore, we prefer a slow etch rate that helps us to achieve the close tolerances we need. We have found that the etch rate for this preferred solution declines to a very low rate at the point where our etch is essentially complete. Thereafter, we do not need to race to neutralize the etchant or to flush the part. Other conventional copper etchants like ferric chloride did not provide us with the control we needed.

FIG. 2 shows a typical copper film 10 of nominal thickness of about 0.1 mil vapor deposited on a suitable circuit board substrate 12 and etched with the process of the present invention. Fine-line Jerusalem Crosses 14 have been cut in the film 10 to line widths of between about 3–10±0.25 mils. Elements 16 are larger, showing that not all the elements in the desired pattern need to be the same size. The close tolerances are reproducibly and reliably achieved with proper masking and monitored immersion in the dip tank.

The concentrated saline solution functions to minimize or eliminate any migration or electrolytic effects that otherwise might upset control of the etch. While we use at least about 150 gm/l NaCl, other common salts or mixtures of salts and other concentrations can be used, as those skilled in the art will recognize. We suggest a minimum concentration of about 125 gm/l. This concentration ensures that the solution will not undergo significant electrolytic changes during the etching process.

The solution is a dilute acid, typically containing only about 5 gm/l $CuCl_2$. We discovered that the etch rate is so low in this case (at least near completion of the etch) that using a heated solution is desirable to accelerate the etch rate at the outset. We suggest immersing the part in a conventional dip tank for chemical etching filled with the preferred $CuCl_2$ saline solution heated to about 140±3° F. We have not thoroughly investigated the relationship between the etchant temperature and the etch rate, but speculate that other temperatures could be used without losing control of the ultimate line width. A lower temperature is preferred to reduce natural convection effects that might disrupt the fine control we need. Convection could make it difficult to obtain fine-line control to the 0.25 mil tolerance over the entire surface of the large, curved parts for which this process is designed and the functionality we need could be lost.

We endeavor to make the process diffusion driven and have attempted to minimize the contribution of migration or convection.

While 5 gm/l $CuCl_2$ is preferred, other concentrations of the acid could undoubtedly be used without loss of control of the line width. We, however, have not investigated to any great degree the relationship between acid concentration and etch rate. We have discovered that using about 5 gm/l $CuCl_2$ in concentrated saline provides an etch rate after about 25–30 minutes immersion of our part slow enough that there is no criticality in quickly removing the part from the tank, neutralizing the acid, or flushing the part This feature is particularly beneficial when working with fine details on large parts of complex curvature where flushing and neutralizing cannot occur simultaneously everywhere on the part.

The pH of our preferred solution is about 3.6. After etching, the solution has a pH of about 3.8.

Figure 1:
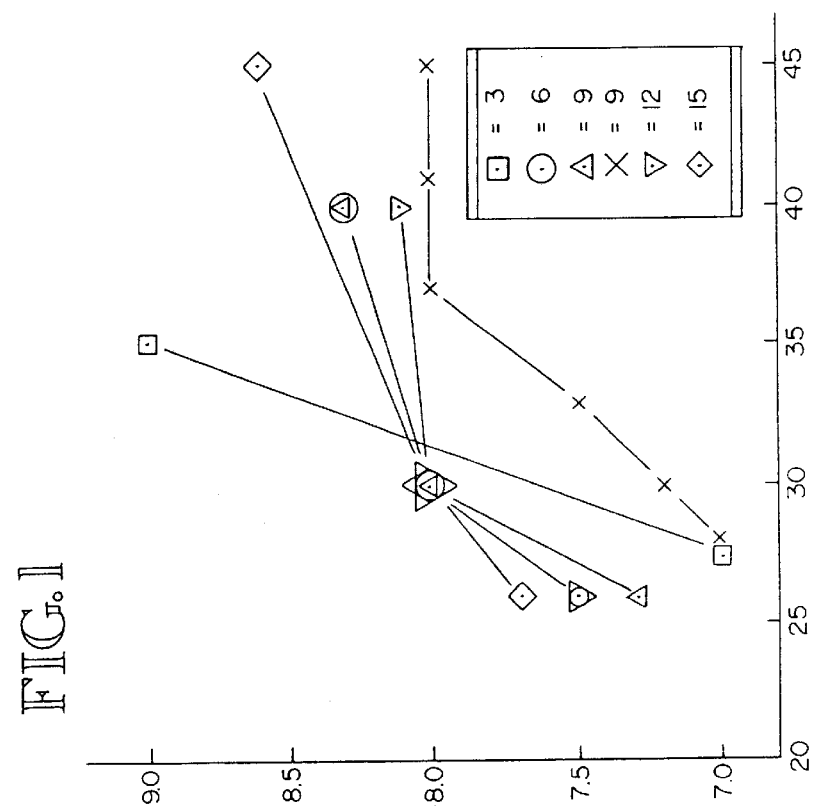
FIG. 1 is a graph showing the line width of etched copper in mils on the ordinate versus immersion time in minutes on the abscissa of the copper in a preferred etchant of the present invention for various exposure times in minutes for the photoresist.

FIG. 1 shows our test results on sample parts overcoated with photoresist exposed for differing lengths of time. This data suggests that the photoresist exposure be in the range of about 6–12 minutes, but we have run only a small number of tests. In each case illustrated in FIG. 1, the test specimen included a photomask of nominal line width of about 7 mils with a target final etched line width of 8.0±0.25 mils on the 0.1 mil thick vapor deposited copper.

The mask is designed so that the exposed initial line width is about 1.0 mil less than the final desired line width (for 0.1 thick copper). For thicker films, the initial line width might vary, but we have not done sufficient testing to discover the relationship between initial line width and film thickness to achieve final line widths of ±0.25 mil tolerance. Our films of interest are 0.1 mil thick vapor deposited copper of complex curvature. FIG. 1 shows the slow etch (or the etch rate decline) when line widths of the desired nominal width (here 8.0 mils) are met. This etch rate decline helps us finish the widths to the close tolerances we require across the part.

Figure 3:
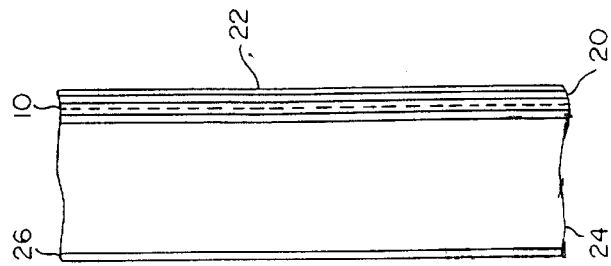
FIG. 3 is a schematic cross-section representation of the copper film of FIG. 2 incorporated into a radome.

FIG. 3 schematically illustrates use of the etched copper film 10 in a radome 100. The film 10 may be secured between two dielectric sheets 18 and 20 near one face of the radome 100. Dielectric sheet 20, in turn, is adhered to a toughened resin composite skin 22. On the other face, the dielectric sheet 18 is adhered to a honeycomb core 24 that, in turn, has a toughened resin composite skin 26 on its outer, exposed face. If desired, several layers of copper film 10 in capacitive or inductive configurations or both separated by dielectric layers may be used. Of course, those skilled in the art will recognize other practical radome constructions where the etched copper film 10 can be used.

Figure 4:
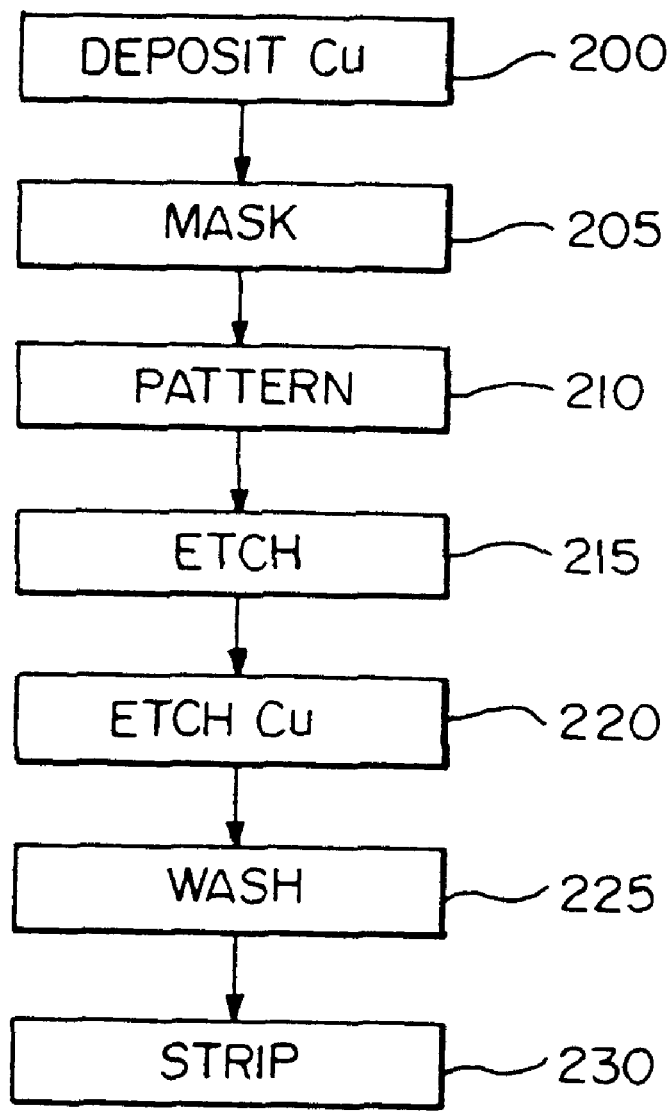
FIG. 4 is a block diagram of a preferred etching process.

FIG. 4 shows the overall process in block form. In the first operation 200, copper film 10 is vacuum deposited on a suitable substrate 12. Then, the film 10 is masked with a suitable photoresist (step 205), followed by patterning the photoresist to identify the intended fine-line elements (step 210). The patterning typically involves exposing selected portions of the photoresist to ultraviolet (UV) radiation which alters the exposed photoresist and which permits its selective removal or etching in step 215 to yield the masked film 10 with openings through the photoresist in the desired pattern. Next, the masked film is immersed in the copper etchant dip tank (step 220) to form the fine-line elements in the copper film. After the etch is complete, the film is washed in step 225 and the photoresist is then stripped (typically by exposing it to UV with subsequent etch) from the film (step 230) to leave the desired product on the protective substrate.

While preferred embodiments have been described, those skilled in the art will recognize modifications or variations which might be made without departing from the inventive concept. Therefore, the description and claims should be interpreted liberally with only such limitation as is necessary in view of the pertinent prior art.

I claim:

1. A radome including a patterned copper film functioning as a frequency selective surface, the film having complex curvature, a nominal thickness of about 0.1 mil, and fine-line circuit elements with controlled undercut etched in the area of complex curvature to line widths ranging from about 3–10 ±0.25 mils, and at least one dielectric sheet to support the film.

2. The radome of claim 1 wherein the copper is vapor deposited on the dielectric sheet.

3. The radome of claim 2 wherein the copper is etched with a concentrated saline solution containing an effective amount of $CuCl_2$ as the etchant.

4. A radome including an etched copper film functioning as a frequency selective surface the film being about 0.1 mil thick wherein elements in the film are etched with reproducible precision to close tolerance of about ±0.25 mil so that from unit to unit the radomes have substantially the same electrical performance, the radome comprising the etched film sandwiched between two dielectric sheets, wherein the film is obtainable by the etching process comprising the steps of:

(a) covering the film with photoresist;

(b) patterning the photoresist to expose portions of the film in selected locations where the elements will be etched;

(c) immersing the film in an aqueous etchant solution of about 5 g cupric chloride/l and sodium chloride for a period of time of about 25–350 min sufficient to achieve the desired etching of the copper to a line of tolerance of at least about ±0.25 mil;

(d) etching the exposed portions during the immersion; and (e) stripping the remaining photoresist to leave an etched film having a pattern of elements precisely etched.

5. The radome of claim 4 wherein the copper has a multicurved surface in at least some of the locations where the elements are etched.

6. The radome of claim 1 further comprising at least one additional dielectric sheet sandwiching the patterned copper film.

7. The radome of claim 6 further comprising a honeycomb core attached to one dielectric sheet remotely from the copper multicurved element.

8. The radome of claim 7 further comprising a toughened resin composite skin attached to the honeycomb core so that the radome has the structure:

toughened resin composite skin: honeycomb core: dielectric sheet: patterned copper film: dielectric sheet.

9. A radome having an etched copper film functioning as a frequency selective surface, the film made with reproducible precision to close tolerance with controlled undercut to provide substantially the same electrical performance from radome to radome by:

(a) masking the film with photoresist;

(b) patterning the photoresist to expose portions of the film where fine-line elements will be etched;

(c) immersing the patterned mask and film in an aqueous etchant solution of cupric chloride and at least about 125 NaCl g/l and pH 3.6–3.8 for a period of time sufficient to etch the film in the exposed portions to achieve the fine-line elements to a line tolerance of at least about +0.25 mil; and (d) stripping the remaining photoresist to leave a patterned film.

10. A radome including a patterned copper film functioning as a frequency selective surface, the film having complex curvature, a nominal thickness of about 0.1 mil, and fine-line circuit elements with controlled undercut etched in the area of complex curvature to line widths ranging from about 3–10±0.25 mils, and at least one dielectric sheet to support the film, wherein the element is a Jerusalem Cross shape having a nominal line width of about 8 mil.

11. A radome including a patterned copper film functioning as a frequency selective surface, the film having complex curvature, a nominal thickness of about 0.1 mil, and fine-line circuit elements with controlled undercut etched in the area of complex curvature to line widths ranging from about 3–10±0.25 mils, and at least one dielectric sheet to support the film, wherein the elements are of at least two sizes.

12. The radome of claim 11 wherein the elements have a repeating unit cell illustrated in FIG. 2.

* * * * *